United States Patent
Chiu et al.

(10) Patent No.: US 9,305,613 B2
(45) Date of Patent: *Apr. 5, 2016

(54) RECONFIGURABLE LOAD-REDUCED MEMORY BUFFER

(71) Applicant: Intel Corporation, Santa Clara, CA (US)

(72) Inventors: Scott Chiu, Folsom, CA (US); Mohamed Arafa, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 71 days.

This patent is subject to a terminal disclaimer.

(21) Appl. No.: 14/173,221

(22) Filed: Feb. 5, 2014

(65) Prior Publication Data

US 2014/0313838 A1    Oct. 23, 2014

Related U.S. Application Data

(63) Continuation of application No. 12/632,919, filed on Dec. 8, 2009, now Pat. No. 8,688,901.

(51) Int. Cl.

| | |
|---|---|
| G06F 12/00 | (2006.01) |
| G11C 7/10 | (2006.01) |
| G06F 13/16 | (2006.01) |
| G11C 5/04 | (2006.01) |
| G06F 13/00 | (2006.01) |
| G06F 13/28 | (2006.01) |
| G06F 1/32 | (2006.01) |

(52) U.S. Cl.
CPC .............. *G11C 7/10* (2013.01); *G06F 13/1673* (2013.01); *G11C 5/04* (2013.01); *G06F 1/3275* (2013.01); *G06F 1/3287* (2013.01); *Y02B 60/1228* (2013.01)

(58) Field of Classification Search
CPC . G06F 1/3287; G06F 1/3275; G06F 13/1673; G11C 7/10; G11C 5/04; Y02B 60/1228
USPC .................. 711/105; 365/189.03, 189.05
See application file for complete search history.

(56) References Cited

U.S. PATENT DOCUMENTS

| | | | |
|---|---|---|---|
| 5,522,064 A | 5/1996 | Aldereguia et al. | |
| 6,330,679 B1 | 12/2001 | Conary et al. | |
| 6,360,314 B1 | 3/2002 | Webb, Jr. et al. | |
| 6,697,006 B1* | 2/2004 | McCartney et al. | 341/155 |
| 6,920,526 B1 | 7/2005 | Sikkink et al. | |
| 7,184,339 B2 | 2/2007 | Bucksch et al. | |
| 2003/0035328 A1* | 2/2003 | Hamamatsu et al. | 365/200 |
| 2006/0004940 A1* | 1/2006 | Saito et al. | 711/1 |
| 2007/0281652 A1 | 12/2007 | Tanaka et al. | |
| 2008/0098251 A1* | 4/2008 | Naujokat | 713/401 |
| 2008/0301485 A1* | 12/2008 | Rombach et al. | 713/600 |
| 2010/0220534 A1 | 9/2010 | Dudeck et al. | |

* cited by examiner

*Primary Examiner* — Mark Giardino, Jr.
(74) *Attorney, Agent, or Firm* — Jordan IP Law, LLC

(57) ABSTRACT

A memory module can include a data buffer having a data bus interface and a dynamic random access memory (DRAM) coupled to the data buffer. The memory module may also include a switch connected in parallel with the data buffer, wherein the switch can selectively bypass the data buffer. In one example, the memory module also includes a registered buffer having an address bus interface, where the switch may selectively bypass the data buffer based on a program signal obtained from an address bus via the address bus interface.

14 Claims, 2 Drawing Sheets

RECONFIGURABLE LOAD-REDUCED MEMORY BUFFER

CROSS-REFERENCE TO RELATED APPLICATIONS

This application is a continuation of U.S. patent application Ser. No. 12/632,919, filed Dec. 8, 2009.

BACKGROUND

1. Technical Field

Embodiments generally relate to memory architectures. In particular, embodiments relate to the selective buffering of memory data signals.

2. Discussion

Memory architectures can be an important aspect of computing systems. In particular, the DDR3 (e.g., Double Data Rate Three Specification, JEDEC Solid State Technology Association, JESD79-3C, November 2008), synchronous dynamic random access memory (SDRAM) interface architecture may have facilitated higher bandwidth storage of the working data of a wide variety of computing systems in recent years. DDR3 SDRAM may often be configured as dual inline memory modules (DIMMs). The most common type of memory module may be un-buffered DIMM (UDIMM) in which all of the DRAM ranks (e.g., chips) are a load on the memory bus. While such a scheme may provide the lowest cost, memory access speed can suffer when higher capacity (e.g., more than 1 DIMM per channel) is needed. Another type of memory module may be the registered DIMM (RDIMM), which can improve access performance by buffering the command and address bus signals on the DIMM. This approach may use a data multiplexer (e.g., DQ-MUX), however, to switch between DIMMs, wherein the DQ-MUX can have a large amount of input/output (e.g., IO) pins when there are multiple DIMMs. In addition, the DQ-MUX may reside on the motherboard, which could unnecessarily increase the cost of the motherboard in instances where multiple DIMMs might not be deployed. Load-Reduced DIMMs (LRDIMMs) can extend buffering to include the data bus and data strobes and improve the signal integrity, but at a potential cost of the extra power that the LRDIMM buffer may consume (e.g., 3× more than the RDIMM buffer).

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may provide for a computing system having a memory controller, a data bus coupled to the memory controller, an address bus coupled to the memory controller, and a dual inline memory module (DIMM). The DIMM may have a data buffer with a data bus interface coupled to the data bus, and a registered buffer with an address bus interface coupled to the address bus. The DIMM may also have a dynamic random access memory (DRAM) with a plurality of ranks coupled to the data buffer and the registered buffer. In addition, the DIMM can have a switch connected in parallel with the data buffer to selectively bypass the data buffer based on a program signal obtained from the address bus via the address bus interface.

Embodiments may also provide for a memory module having a data buffer with a data bus interface. The memory module can also have a DRAM coupled to the data buffer and a switch connected in parallel with the data buffer. The switch may selectively bypass the data buffer based on the program signal.

Embodiments may also provide for a method of operating a memory module in which a program signal is received at a data buffer coupled to a data bus and a DRAM. A switch connected in parallel with the data buffer may be placed in at least one of a switch mode and a buffer mode based on the program signal.

Figure 1:
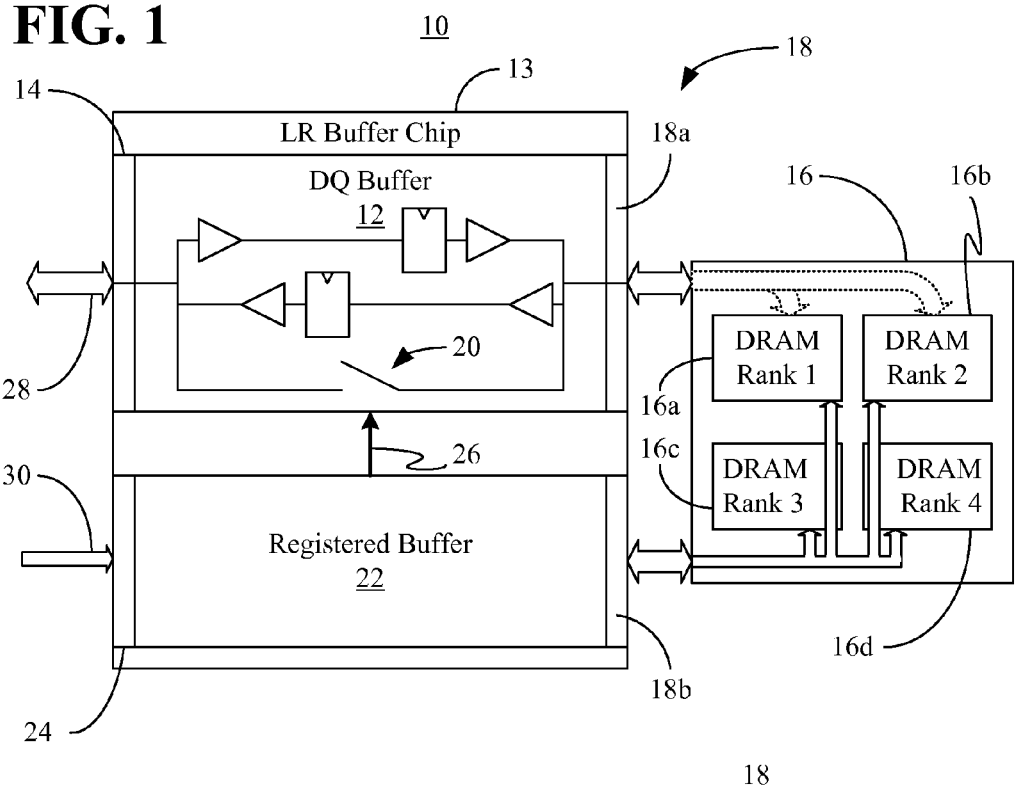
FIG. 1 is a block diagram of an example of a memory module according to an embodiment.

FIG. 1 shows a memory module 10 having a load-reduced (e.g., LR) buffer chip 13. The illustrated LR buffer chip 13 has a data (e.g., DQ) buffer 12 with a data bus interface 14. The memory module 10 may also include a DRAM 16 coupled to the DQ buffer 12 via a data portion 18a of a DRAM interface 18. In one example, the memory module 10 might be configured as a dual inline memory module (DIMM) and the DQ buffer 12 can provide retiming functionality for the signals being transferred through the DQ buffer 12. In particular, the data bus interface 14 can transfer data (e.g., DQ) and data strobe (e.g., DQS) signals between the DQ buffer 12 and a DQ bus 28. The DQ buffer 12 could be a single component or distributed along the width of the DQ bus 28. In addition, the data portion 18a of the DRAM interface 18 may transfer the DQ and DQS signals between the DQ buffer 12 and the DRAM 16, which may include a plurality of ranks 16a-16d. The DRAM 16 and interface 18 could be compliant with DDR3, DDR4, or any other suitable memory interface architecture.

The illustrated memory module 10 also includes a switch 20 connected in parallel with the DQ buffer 12, wherein the switch 20 may selectively bypass the DQ buffer 12. The memory module 10 may also include a register/registered buffer 22 having an address bus interface 24 to transfer command, control and address signals between the registered buffer 22 and a command, control and address (CCA) bus 30. An address portion 18b of the illustrated DRAM interface 18 can transfer the CCA signals between the registered buffer 22 and the DRAM 16.

The illustrated switch 20 can selectively bypass the DQ buffer 12 based on a program signal 26 obtained from the CCA bus 30 via the address bus interface 24. For example, the illustrated program signal 26 could power down the DQ buffer 12 and selectively activate the switch 20 depending on whether the memory module 10 is being addressed. In such a case, the module 10 can be placed in a "switch mode" in which the DQ buffer 12 is bypassed and each of the DRAM ranks 16a-16d may function as an individual load on the DQ bus 28. The power savings associated with powering down the DQ buffer 12 may be significant, particularly if many memory modules 10 are deployed in the computing system in question. In situations where the memory module 10 is in switch mode, but is not being addressed (e.g., the switch is not activated), the only termination seen by the DQ bus 28 may be the termination of the DQ buffer 12.

Alternatively, the program signal 26 might power up the DQ buffer 12 (perhaps, in a low power state) and deactivate the switch 20. In such a case, the module 10 can be placed in a "buffer mode" in which the DQ buffer 12 is in operation and is the only load seen by the DQ bus 28. Accordingly, significant performance advantages also can be realized during operation of the memory module 10 due to the buffering of data signals.

Figure 2A:
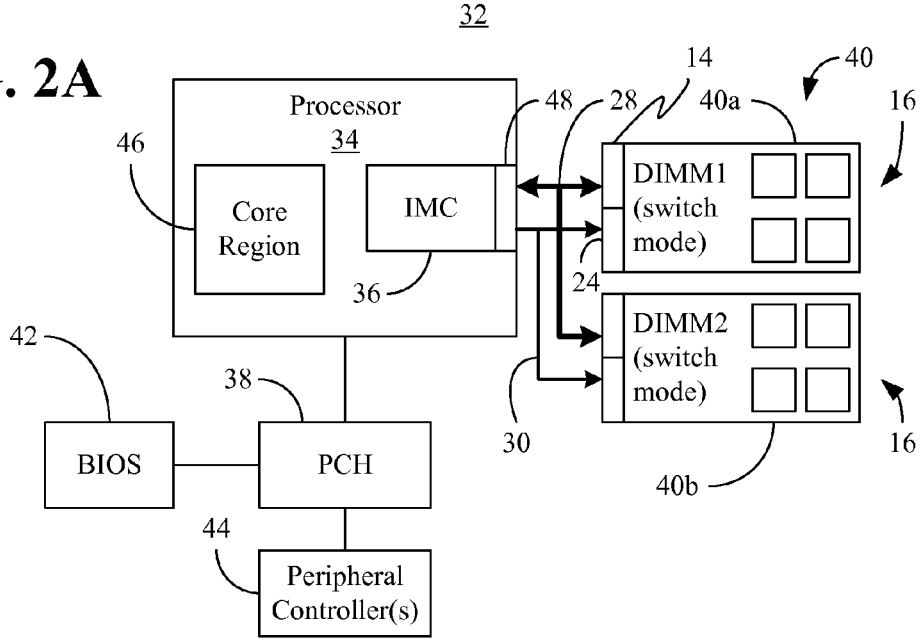
FIGS. 2A and 2B are block diagrams of examples of computing systems according to embodiments.

Turning now to FIG. 2A, a computing system 32 is shown. The system 32 may be a portion of a computing platform such as a server, desktop, test system, design/debug tool, laptop, personal digital assistant (PDA), wireless smart phone, media player, imaging device, or any other suitable apparatus. In the illustrated example, the system 32 includes a processor 34, which may include a core region 46 with one or several processor cores, an integrated memory controller (IMC) 36, a platform controller hub (PCH) 38, a plurality of DIMMs 40 (40*a*-40*b*), a basic input/output system (BIOS) 42 and one or more peripheral controllers 44. Each DIMM 40 could include the components and/or functionality of the DIMM 10 (FIG. 1), already discussed. Thus, each DIMM 40 may include a data buffer having a data bus interface 14 coupled to the DQ bus 28, and a register/registered buffer having an address bus interface 24 coupled to the CCA bus 30.

Each DIMM 40 may also include a DRAM 16 with a plurality of ranks coupled to the data buffer and the registered buffer, and a switch connected in parallel with the data buffer to selectively bypass the data buffer based on a program signal obtained from the CCA bus 30 via the address bus interface 24. In the illustrated example, the DIMMs 40 are operated in switch mode, wherein the data buffers of the DIMMs 40 are powered down and the switches are selectively activated based on whether the particular DIMM 40 is addressed. Accordingly, if a particular DIMM 40 is being addressed, it may appear to the DQ bus 28 as four loads (corresponding to the four ranks of the DRAMs), and if it is not being addressed, it may appear to the DQ bus as a single load. In either case, the illustrated example may consume less power due to the data buffers being powered down.

Figure 2B:
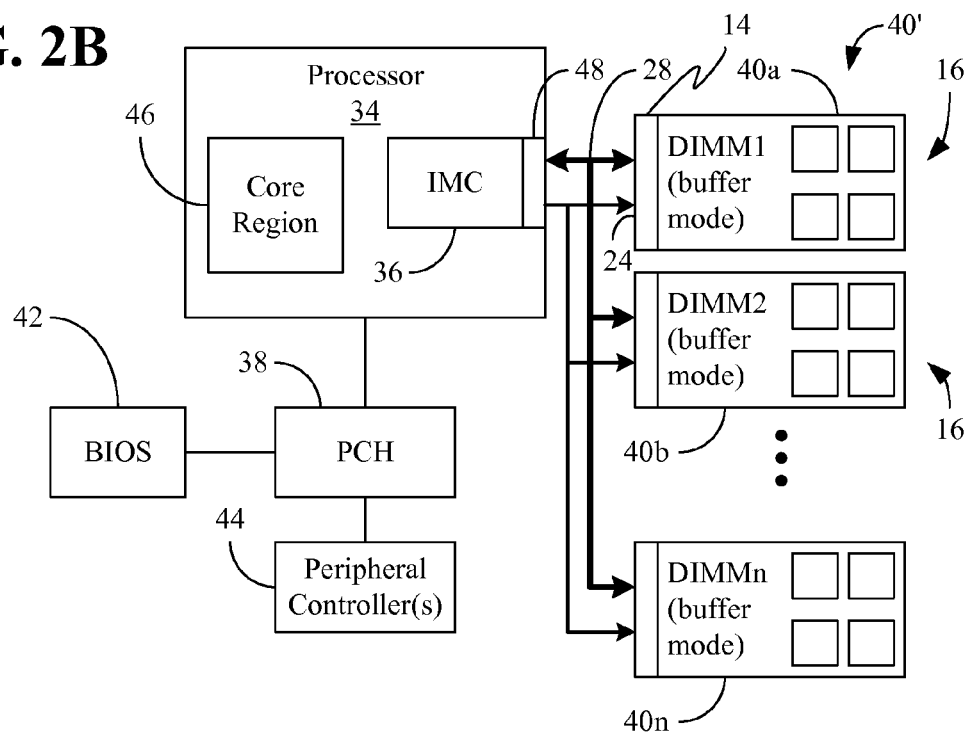

By contrast, FIG. 2B shows a computing system 33 in which the system memory has been expanded to include a larger number of DIMMs 40' (40*a*-40*n*). In the illustrated example, the DIMMs 40' have been placed in buffer mode. Thus, the data buffers may be powered up and the switches may be deactivated in order to achieve enhanced performance.

With continuing reference to FIGS. 2A and 2B, the illustrated processor 34 is integrated with the IMC 36 onto a common system on chip (SoC), and the IMC 36 may have a memory bus interface 48 that links the IMC 36 with the DIMMs 40, 40' via the DQ bus 28 and the CCA bus 30. Alternatively, the processor 34 could be separate from the IMC 36, and may communicate with the IMC 36 over an interface such as a front side bus (FSB), a point-to-point interconnect fabric, or any other suitable interface. The PCH 38 and/or an input/output hub (IOH, not shown) could also be incorporated with the processor 34 and IMC 36 onto a common SoC. The illustrated peripheral controllers 44 might include a Wi-Fi (e.g., Institute of Electronics Engineers/IEEE 802.11a, b, g, n) network interface, an Ethernet controller (e.g., IEEE 802.3), PC Card controller (e.g. CardBus PCM-CIA standard), and so on. The PCH 38 and/or IOH may also have internal controllers such as USB (Universal Serial Bus, e.g., USB Specification 2.0, USB Implementers Forum), Serial ATA (SATA, e.g., SATA Rev. 3.0 Specification, May 27, 2009, SATA International Organization/SATA-IO), High Definition Audio, and other controllers. In one embodiment, a chipset defined by the IMC 36, PCH 38 and/or IOH may include one or more blocks (e.g., chips or units within an integrated circuit) to perform various interface control functions (e.g., memory control, graphics control, I/O interface control, and the like). As already noted, these circuits may be implemented on one or more separate chips and/or may be partially or wholly implemented within the processor 34.

In one example, the program signal may be generated by the BIOS 42, which could be programmed during manufacture of the computing system(s) 32, 33 and/or subsequently, perhaps when new DIMMs 40, 40' are added to the computing system(s) 32, 33. As a result, the illustrated system(s) 32, 33 have as pay-as-you-go functionality that can reduce the cost of the computing system(s) 32, 33 and enables the purchase of the computing system(s) 32, 33 to be effectively decoupled from subsequent memory upgrades. The program signal may also be generated dynamically and on-the-fly based on based on real-time power and performance conditions and requirements of the system(s) 32, 33. For example, a power control unit (not shown) may be used to control the power and performance state transitions of the cores of the processor 34 as well as to inform the IMC 36 of any state changes that may impact the mode configuration of the DIMMs 40. The IMC 36 could then modify the mode configuration as appropriate.

As already noted, the system(s) 32, 33 may implement a variety of different computing devices or other appliances with computing capability. Such devices include but are not limited to test systems, design/debug tools, laptop computers, notebook computers, PDAs, cellular phones, audio and/or video media players, desktop computers, servers, and the like. The system(s) 32, 33 could constitute one or more complete computing systems or alternatively, it could constitute one or more components useful within a computing system.

Figure 3:
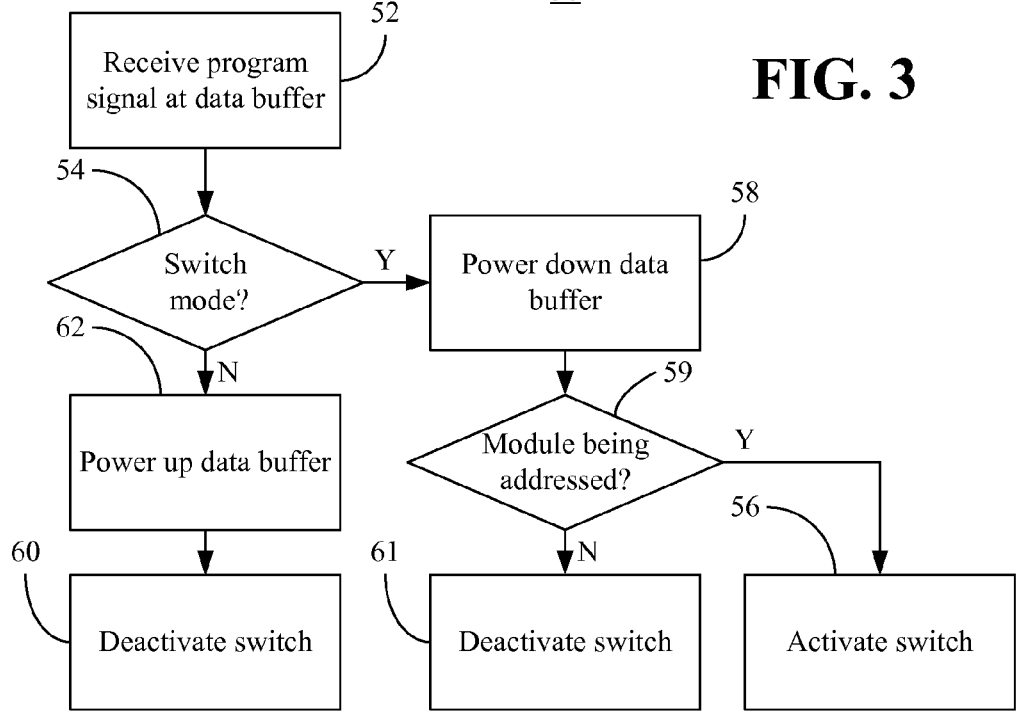
FIG. 3 is a flowchart of an example of a method of operating a memory module according to an embodiment.

Turning now to FIG. 3, a method 50 of controlling a memory module is shown. The method 50 may be implemented in fixed-functionality hardware, microcode, software, or any combination thereof. For example, hardware implementations might involve the use of circuit technology such as application specific integrated circuit (ASIC), complementary metal oxide semiconductor (CMOS) or transistor-transistor logic (TTL) technology, or any combination or variation thereof. Processing block 52 provides for receiving a program signal at a data buffer coupled to a data bus and a DRAM. As already noted, the program signal could be received from an address bus via an address bus interface of a registered buffer. In particular, the program signal may be generated by a BIOS. Generally, a switch connected in parallel with the data buffer can be placed in at least one of a switch mode and a buffer mode based on the program signal. If it is determined at block 54 that the data buffer is to be operated in the switch mode, the data buffer may be powered down at block 58 and a determination can be made at block 59 as to whether the memory module in question is being addressed. If so, the switch may be activated at block 56. Otherwise, block 61 provides for deactivating the switch. If it is determined at block 54 that switch mode is not selected (e.g., buffer mode is selected), illustrated block 62 provides for powering up the data buffer, and the switch may be deactivated at block 60.

Thus, techniques described herein provide for a programmable buffer that can either work as a LRDIMM buffer or as a RDIMM buffer. A key component added is a switch, in parallel with a retiming buffer, to bypass the data/data strobe (DQ/DQS) directly from input to output or to isolate the DRAM load from the memory bus. Unlike a buffer on the mother board, such a solution provides a true pay-as-you-go solution as the memory capacity increases: For a lower number of DIMMs, the buffer can run in switch mode consuming comparable power to RDIMMs with better signal loading; when the number of DIMMs increases, the buffer can move to a full-buffer mode for enhanced performance. This approach can time-proof the end user purchases of memory modules when a future memory upgrade is desired.

Simply put, the additional switch in the DQ/DQS path can provide a register buffer-like of operation in addition to standard LRDIMM buffer operation. For smaller memory loads, the buffer can operate in switch mode by turning on the switch, and powering down the data buffering path. The result may be a lower power mode comparable to a RDIMM buffer. Moreover, this mode of operation may give a lower DIMM loading to the host bus for a potential signal integrity improvement, since the DIMM buffer not being accessed can be switched off with the corresponding memory buffer switch, and may be isolated from the host bus. When more DIMMs are added, the user can decide to improve performance further by running in full-buffer mode at higher power consumption. This technique can be fully controllable by software, thus enabling the mode change depending on the application or the work load.

Embodiments described herein are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A memory module comprising:
a data buffer having a data bus interface;
a dynamic random access memory coupled to the data buffer;
a switch connected in parallel with the data buffer, the switch to selectively bypass the data buffer when the data buffer is powered down and the memory module is being addressed; and
a registered buffer having an address bus interface, wherein the switch is to selectively bypass the data buffer based on a program signal obtained from an address bus via the address bus interface.

2. The memory module of claim 1, wherein the address bus interface is to transfer at least one of command signals, control signals and address signals between the registered buffer and an address bus.

3. The memory module of claim 1, wherein a program signal is to power down the data buffer and selectively activate the switch when the memory module is being addressed.

4. The memory module of claim 1, wherein a program signal is to deactivate the switch and power up the data buffer.

5. The memory module of claim 1, wherein the data bus interface is to transfer at least one of data signals and data strobe signals between the data buffer and a data bus.

6. The memory module of claim 1, wherein the memory includes a plurality of ranks.

7. The memory module of claim 1, wherein the memory includes a dual inline memory module.

8. A method comprising:
operating a memory module including,
a data buffer having a data bus interface;
a dynamic random access memory coupled to the data buffer;
a switch connected in parallel with the data buffer, the switch selectively bypassing the data buffer when the data buffer is powered down and the memory module is being addressed; and
a registered buffer having an address bus interface, wherein the switch selectively bypasses the data buffer based on a program signal obtained from an address bus via the address bus interface.

9. The method of claim 8, wherein the address bus interface transfers at least one of command signals, control signals and address signals between the registered buffer and an address bus.

10. The method of claim 8, wherein a program signal powers down the data buffer and selectively activates the switch when the memory module is being addressed.

11. The method of claim 8, wherein a program signal deactivates the switch and powers up the data buffer.

12. The method of claim 8, wherein the data bus interface transfers at least one of data signals and data strobe signals between the data buffer and a data bus.

13. The method of claim 8, wherein the memory includes a plurality of ranks.

14. The method of claim 8, wherein the memory includes a dual inline memory module.

* * * * *